(12) United States Patent
Desard et al.

(10) Patent No.: US 12,171,088 B2
(45) Date of Patent: Dec. 17, 2024

(54) SEALING MEMBER

(71) Applicant: Corning Research & Development Corporation, Corning, NY (US)

(72) Inventors: Christophe Desard, Herbignac (FR); Thierry Naudin, Orvault (FR)

(73) Assignee: CORNING RESEARCH & DEVELOPMENT CORPORATION, Corning, NY (US)

( * ) Notice: Subject to any disclaimer, the term of this patent is extended or adjusted under 35 U.S.C. 154(b) by 546 days.

(21) Appl. No.: 17/484,920

(22) Filed: Sep. 24, 2021

(65) Prior Publication Data

US 2022/0104406 A1 Mar. 31, 2022

(51) Int. Cl.
*H05K 9/00* (2006.01)
*H01B 17/30* (2006.01)
*F16J 15/12* (2006.01)

(52) U.S. Cl.
CPC ........... *H05K 9/0015* (2013.01); *H01B 17/30* (2013.01); *F16J 15/123* (2013.01)

(58) Field of Classification Search
None
See application file for complete search history.

(56) References Cited

U.S. PATENT DOCUMENTS

| | | | | |
|---|---|---|---|---|
| 5,510,576 A | * | 4/1996 | Tenace | H02G 9/10 |
| | | | | 174/658 |
| 6,069,320 A | * | 5/2000 | Rocci | H02G 15/013 |
| | | | | 174/93 |
| 6,280,220 B1 | | 8/2001 | Horner | |
| 7,338,320 B2 | | 3/2008 | Kobayashi | |
| 10,811,862 B2 | * | 10/2020 | Kempeneers | H02G 15/046 |
| 2006/0219426 A1 | * | 10/2006 | Holmberg | H02G 3/088 |
| | | | | 174/135 |
| 2007/0089894 A1 | * | 4/2007 | Holmberg | H02G 15/04 |
| | | | | 174/50.56 |

(Continued)

FOREIGN PATENT DOCUMENTS

CA 2068552 C 12/1994
EP 1187287 A1 3/2002
(Continued)

OTHER PUBLICATIONS

European Patent Application No. 20199274.0 European Search Report dated Feb. 25, 2021; 8 pages; European Patent Office.

*Primary Examiner* — Xanthia C Relford
*Assistant Examiner* — Xanthia C Cunningham
(74) *Attorney, Agent, or Firm* — Tamika A. Crawl-Bey

(57) ABSTRACT

According to the present disclosure, a sealing member for providing a seal around a cable is provided. The sealing member comprises a resiliently deformable material and has a passage along its axis for receiving a cable. The sealing member comprises a first end, a second end and an intermediate portion, the first end disposed at the opposite end of the sealing member from the second end along the axis and the intermediate portion disposed between the first end and the second end. The intermediate portion comprises a circumferential groove disposed on its outer surface such that when a compressing force is applied to the first end and the second end along the axis of the sealing member the intermediate portion deforms to cause the passage to narrow.

20 Claims, 9 Drawing Sheets

(56) References Cited

U.S. PATENT DOCUMENTS

| | | | | |
|---|---|---|---|---|
| 2011/0121520 A1* | 5/2011 | Badman | .................. | H02G 3/22 |
| | | | | 277/616 |
| 2013/0315551 A1* | 11/2013 | Claessens | ............ | G02B 6/4429 |
| | | | | 385/136 |
| 2014/0166341 A1* | 6/2014 | Waterland, III | ..... | H02G 3/0493 |
| | | | | 174/152 G |
| 2014/0199035 A1* | 7/2014 | Bunte | ...................... | G02B 6/44 |
| | | | | 385/100 |
| 2017/0102507 A1* | 4/2017 | Menguy | ............... | G02B 6/4248 |
| 2017/0363817 A1* | 12/2017 | Kempeneers | ........ | H02G 15/013 |
| 2018/0157002 A1* | 6/2018 | Bishop | ............... | H02G 15/013 |

FOREIGN PATENT DOCUMENTS

| | | |
|---|---|---|
| EP | 1195856 A1 | 4/2002 |
| EP | 3480636 A1 | 5/2019 |
| WO | 2010/047920 A2 | 4/2010 |

\* cited by examiner

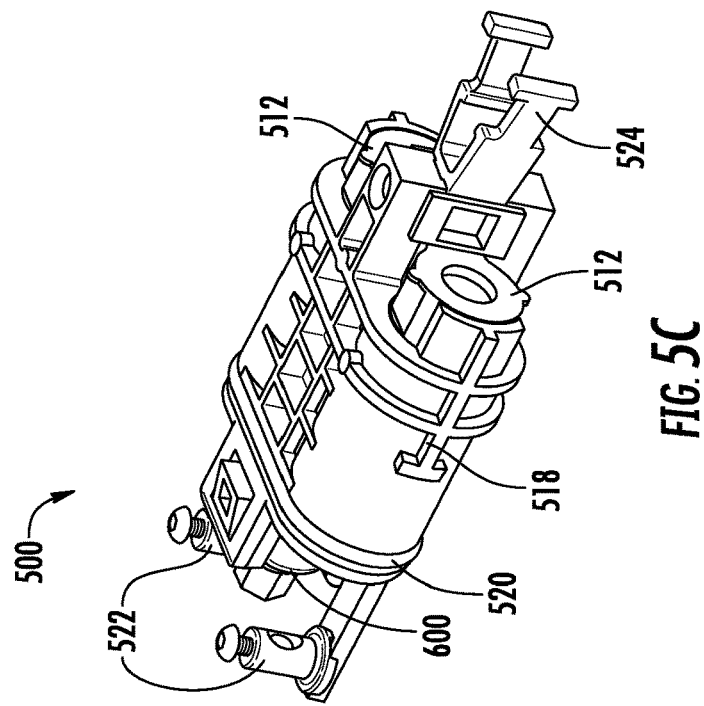
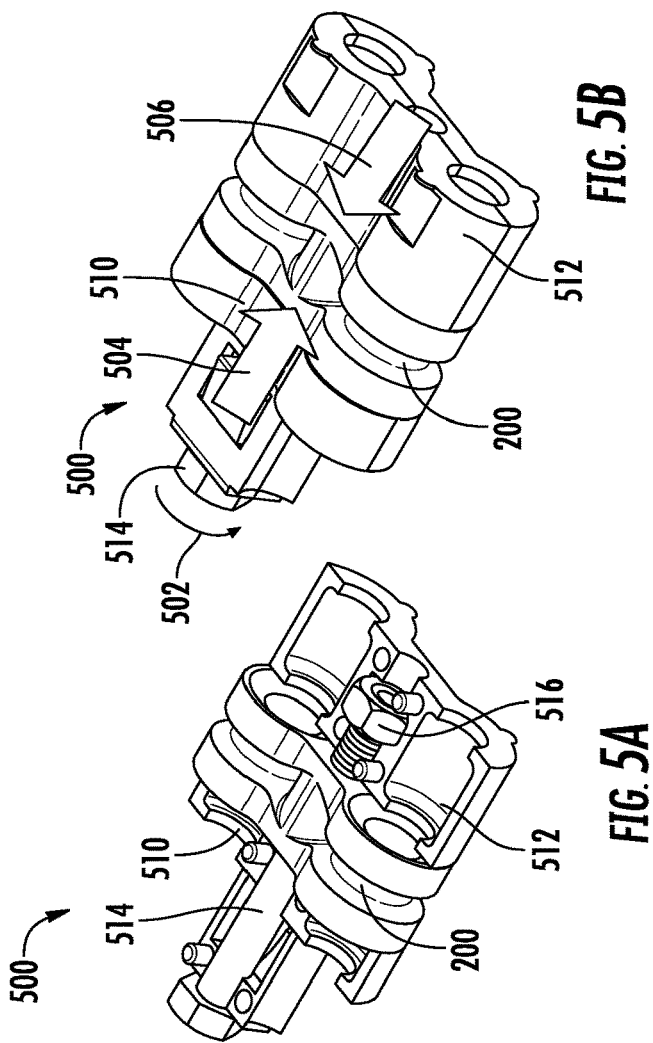
FIG. 5C
FIG. 5B
FIG. 5A

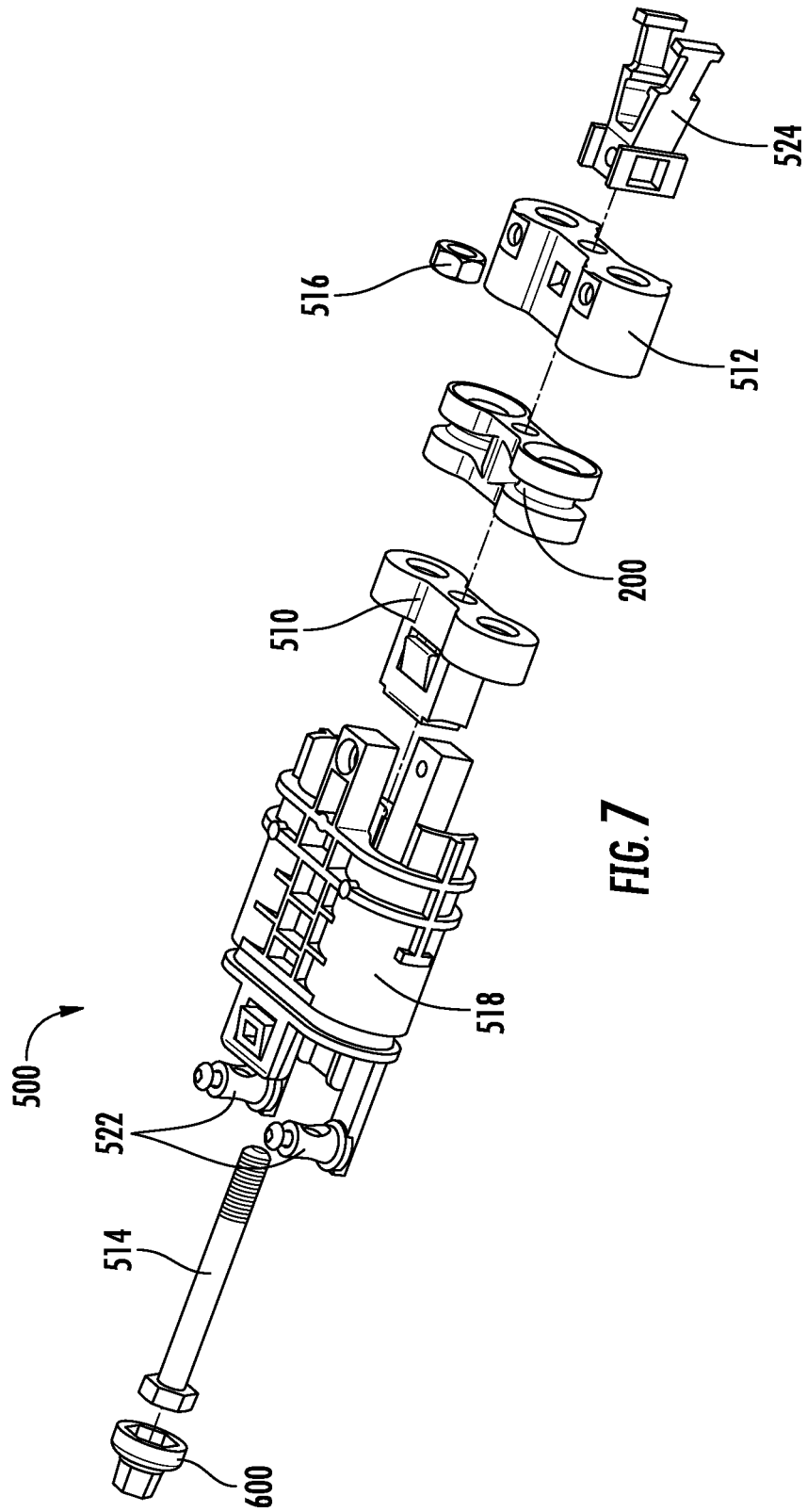

SEALING MEMBER

CROSS-REFERENCE TO RELATED APPLICATION

This application claims the benefit of priority under 35 U.S.C. § 119 of European Patent Application No. EP 20199274.0, filed Sep. 29, 2020, the content of which is relied upon and incorporated herein by reference in its entirety.

BACKGROUND

Cables are used throughout the modern world to transmit power and information, for example through electrical or fiber-optic cables. In order to achieve this, cables usually pass from an outdoor environment into an enclosed environment, such as a junction box or a building. Such enclosed environments typically need to prevent external environmental effects, such as rain and dirt, from making an ingress into the enclosed environment. That is, such enclosed environments are often required to be weather sealed.

In order to achieve such weather sealing, grommets are typically used around a cable at the point of entry into the enclosed environment. Such known grommets comprise a tube of resiliently deformable material and have an aperture through which a cable is threaded. Either side of the grommet a rigid body such as a flange is placed and through the tightening of a screw which connects the flanges either side of the grommet the flanges are forced towards one another. This arrangement is typically housed in a casing. The grommet, being made of a resiliently deformable material such as rubber, is compressed by the two flanges forcing the aperture around the cable to be narrowed. Eventually, if the correct size grommet relative to the thickness of the cable has been used, once the screw is turned sufficiently then the grommet will have deformed enough to cause the aperture to narrow sufficiently to create a seal around the cable. An example of a system employing such a sealing arrangement is a 3M™ External Cable Assembly Module (ECAM) Double Cable Entry Port such as the ECAM-18MM-D, also known as a double ECAM.

In order for an engineer or installer to know when the grommet has been sufficiently compressed, one or a series of markings upon the flanges are used. As the screw is turned and the grommet compressed, the flanges move closer together, moving further inside the casing. The engineer can determine when a good seal has been formed when the marking on the flange reaches the edge of the casing.

Whilst such prior art sealing apparatuses are capable of providing a weather seal around a cable, they have a number of disadvantages.

One disadvantage is that such prior art grommets can only be used with a limited range of cable thicknesses. Typically, a grommet can only be used with approximately a 3 mm range of cable thicknesses, e.g. for cables with a diameter of 3 mm to 6 mm or with a diameter of 9 mm to 12 mm. This is because the grommet only has a limited range of deformation. A grommet for use with cables of thickness 9 mm to 12 mm will not be able to deform sufficiently to form a seal around a cable of 6 mm. As such, an engineer operating on cables that require sealing must carry around a plurality of different sized grommets. This is both inconvenient in that it means an engineer must carry more equipment but it also creates the risk of user error because an engineer may inadvertently use a grommet that is too large for the cable that requires sealing, meaning that the required seal will not be created. This also means that manufacturers of sealing grommets must make a wide range of grommets to account for the wide range of cable thicknesses in use. This increases the cost and complexity of manufacturing.

Another disadvantage of the apparatuses and techniques used in the prior art is that the means for determining when a seal has been formed is prone to errors. The mark that is used on the flange is, due to the size of such devices, necessarily small. This makes it hard for an engineer to see the mark, especially in the adverse environments in which such devices are often used where the marking may be obscured, for example by mud or dirt. This means that frequently engineers do not sufficiently tighten the screw enough to compress the grommet to provide a tight seal. Furthermore, if too large a grommet is used then the engineer may tighten the screw to the marking correctly yet a seal would still not have been formed because the grommet would be the wrong size. Nevertheless, once the incorrect grommet had been installed and the engineer had tightened the screw to the mark, there would be no indication to the engineer that a seal had not been formed.

Embodiments of the present invention may address one or more of these problems, amongst others.

SUMMARY OF INVENTION

The invention is defined in the independent claims, to which the reader is now directed. Preferred or advantageous features are set out in the dependent claims.

According to a first aspect of the invention, a sealing member for providing a seal around a cable is provided. The sealing member comprises a resiliently deformable material and has a passage along its axis for receiving a cable. The sealing member comprises a first end, a second end and an intermediate portion, the first end disposed at the opposite end of the sealing member from the second end along the axis and the intermediate portion disposed between the first end and the second end. The intermediate portion comprises a circumferential groove disposed on its outer surface such that when a compressing force is applied to the first end and the second end along the axis of the sealing member the intermediate portion deforms to cause the passage to narrow.

The narrowing of the sealing member passage causes a seal to be formed around a cable that is inserted into said passage. The circumferential groove increases the amount that the sealing member can deform as pressure is applied from either end, enabling it to seal a wider range of cable diameters than was previously possible. This means that engineers need to carry fewer sizes of sealing member, if more than one size is needed at all, and reduces the likelihood of the engineer installing an incorrect sealing member. Furthermore, it simplifies the manufacturing processes for the manufacturers of sealing devices.

Optionally, the first and second ends each comprise a conic cutaway. The axis of the conic cutaway is preferably coaxial with the axis of the sealing member.

The conic cutaway directs pressure applied at the ends of the sealing member towards the intermediate portion of the sealing member, to aid deformation and further increase the range of cable thicknesses the sealing member can provide a seal around. Other shapes may be used other than a conic shape, provided that the cutaway decreases in diameter in the direction from the end of the sealing member on which the cutaway is located to the opposing end.

Optionally, the groove has a "V" shaped cross section.

Such a groove with a "V" shaped cross section concentrates the applied force at the base of the groove to increase deformation, again increasing the range of cable thicknesses the sealing member can provide a seal around.

Optionally, the sealing member has a hardness of less than 70 ShA.

Such a hardness ensures the material of the sealing member is sufficiently compressible to enable it to deform appropriately.

Optionally, the sealing member is constructed from a thermoset rubber.

Thermoset rubber has good structural properties as well as being relatively easy to work. It also provides good thermal stability and chemical resistance.

Optionally, the thermoset rubber is one of silicone rubber, polyurethane rubber, and nitrile rubber (NBR). Silicone is highly resistant to heat and chemicals. Polyurethane is abrasion resistant. NBR is more low-cost. Alternatively, the raw material used for the sealing member could be any other thermoset rubber with low hardness.

Optionally, the sealing member comprises a slit running from the first end to the second end to enable a cable to be placed into the passage through the slit.

This enables the sealing member to be applied to mid-portions of cables without having to cut the cables or pass the end of the cable through the sealing member passage and pulling the rest of the cable through behind.

According to a second aspect of the invention, a multi sealing member for providing seals around two or more cables is provided. The multi sealing member comprises two or more sealing members joined to one or more of the other sealing members by an adjoining portion.

Multi sealing members allow a single apparatus to provide a seal around numerous cables in a compact fashion.

Optionally, the adjoining portion of the multi sealing member includes a first portion that adjoins the first ends of the respective sealing members and a second portion that adjoins the second ends of the respective sealing members, with the first portion and the second portion being separated such that a gap is defined between them.

Having such a gap allows the multi sealing member to provide sealing for multiple cables while maintaining a high level of compressibility because the adjoining portion does not provide any resistance to the compression itself, enabling a wide range of cable thicknesses to be sealed.

Optionally, the two or more sealing members of the multi sealing member are arranged circumferentially about passageway provided for a compressor component, such as a screw, to pass through to apply a compressive force to the two or more sealing members. The passageway may be defined by the adjoining portion.

By having the two or more sealing members arranged in such a manner, the size of the adjoining portion required can be reduced. This reduces the size of the multi sealing member, and also means that a single compression means, such as a single screw, can be used to compress the multi sealing member and provide a seal around multiple cables.

According to a third aspect of the invention, a dual sealing member for providing seals around two cables is provided. The dual sealing member comprises a multi sealing member according to the second aspect of the invention with only two sealing members, or a first and second sealing member according to the first aspect of the invention, adjoined by an adjoining portion.

Such a dual sealing member enables seals to be provided around two cables, such as an input and an output cable.

Optionally, the adjoining portion includes a first portion that adjoins the first ends of the first and second sealing members and a second portion that adjoins the second ends of the first and second sealing members and wherein the first portion and the second portion are separated such that a gap is defined between them. The adjoining portion therefore adjoins the first ends of the first and second sealing members but does not adjoin the mid-portions of the first and second sealing members since a gap is provided in the direction along the passageways of the sealing members.

Having such a gap allows the dual sealing member to provide sealing for two cables while maintaining a high level of compressibility because the adjoining portion does not provide any resistance to the compression itself, enabling a wide range of cable thicknesses to be sealed.

Optionally the passages of the first and second sealing members may be parallel to one another.

Optionally the first and second sealing members and, further optionally the adjoining portion(s), are formed integrally as a single piece.

According to a fourth aspect of the invention, a cable sealing apparatus is provided comprising a sealing member or multi sealing member or dual sealing member according to the first, second or third aspects of the invention and a compression means to apply a compressive force to the first end and second end of the sealing member.

Such a compression means allows the sealing member to be compressed, providing a seal around a wide range of cable thicknesses.

Optionally, the compression means comprises a first rigid body, such as a flange, configured to abut the first end of the sealing member, a second rigid body, such as flange, configured to abut the second end of the sealing member, and a compressor component configured to exert a force on the first and second rigid bodies such that the first and second rigid bodies apply a compressive force to the first and second ends of the sealing member.

The flanges interact with the compressor component to provide the required compressive force allowing a seal to be formed around a wide range of cable thicknesses.

Optionally, the compressor component comprises a screw extending along the axis of the sealing member and wherein the first and second flanges engage with the screw such that when the screw is rotated it can cause the first and second flanges to apply a compressive force to the first and second ends of the sealing member.

Such a screw allows the compression of the sealing member to be controlled closely and varied widely by simply turning the screw to a greater or lesser extent. This means that one compression means can enable the sealing of a wide range of cable thicknesses.

Optionally, the screw passes through a passageway defined by the adjoining portion.

Having the screw pass through the adjoining portion allows a compressive force to be applied to all or both sealing members of a multi or dual sealing member with a single screw. When the screw passes through an adjoining portion which has two or more sealing members arranged circumferentially about it, each of the sealing members can be compressed via the single screw to ensure that an force is applied to each sealing member of the dual or multi sealing member to provide equal compression to each sealing member.

Optionally, the screw comprises a breakable screw head configured to detach from the screw when a predetermined torque is applied to the breakable screw head, preventing the screw from being further tightened with the breakable screw head.

Such a breakable screw head ensures that the correct amount of compression can easily be applied regardless of the cable thickness used and means that the installer is not required to correctly judge the correct amount the screw should be tightened to provide a seal, such as is the case with the markings on the device used in the prior art. This greatly reduces the likelihood of operator error.

Optionally, the breakable screw head is disposed over an integral screw head of the screw.

This ensures that the breakable screw head can easily be used with, and applied to, existing screws and cable sealing apparatuses.

Optionally, the breakable screw head comprises a frangible portion configured to break at a predetermined location.

The frangible portion is configured to predictably break when a torque above a predetermined value is applied. The frangible portion is located at a particular location on the screw head and makes it is easy for an engineer or installer to correctly apply the correct torque.

Optionally, the cable sealing apparatus may further comprise an outer casing for retaining the sealing member and the compression means.

The outer casing provides protection for the inner components, as well as keeping them in place and providing a seal with external equipment.

Optionally, the cable sealing apparatus may further comprise one or more cable anchorage devices for retaining cables relative to the cable sealing apparatus when inserted into the cable sealing apparatus.

Cable anchorage devices retain the cable and prevent forces on the cable from dislodging the cables or otherwise compromising the seal.

According to a fourth aspect of the present invention a cable sealing apparatus is provided. The cable sealing apparatus comprises one or more sealing members each having a first and second end and a passage therebetween to receive a cable. The sealing members deform when a compressing force is applied to the first end and the second end along the axis of the sealing member passage to cause the passage to narrow. The narrowing of the sealing member passage causes a seal to be formed around a cable that is inserted into said passage. The cable sealing apparatus includes a compression means to apply a compressive force to the first end and second end of the sealing member. The compression means includes a screw extending along the axis of the sealing member such that when the screw is rotated it can cause a compressive force to be applied to the first and second ends of the sealing member. The screw comprises a breakable screw head configured to detach from the screw when a predetermined torque is applied to the breakable screw head, preventing the screw from being further tightened with the breakable screw head.

The one or more sealing members may be any of the sealing members described herein or may alternatively be any suitable sealing member, including known sealing members. The sealing members are operable to deform to form a seal around a cable when a compressive force is applied to both ends of the sealing member.

Optionally the breakable screw head is disposed over an integral screw head of the screw.

Optionally the breakable screw head comprises a frangible portion configured to break at a predetermined location The compression means optionally comprises a first flange configured to abut the first end of the one or more sealing members and a second flange configured to abut the second end of the one or more sealing members. The screw is configured to exert a force on the first and second flanges such that the first and second flanges apply the compressive force to the first and second ends of the sealing member. The first and second flanges engage with the screw such that when the screw is rotated it can cause the first and second flanges to apply the compressive force to the first and second ends of the sealing member.

According to a fifth aspect of the invention, a cable sealing system is provided. The cable sealing system comprises a cable sealing apparatus according to the fourth aspect of the invention and a cable protection member, the cable protection member comprising a deformably resilient material formed into a spiral shape, such that when the cable protection member is placed around a cable the cable protection member deforms causing the cable protection member to grip to itself and to the cable.

Optionally, the cable sealing apparatus further comprises a cable retention means, wherein the cable protection member is configured, in use, to be disposed between the cable and the cable retention means. The cable retention may provide a strain relief function by applying a strain relief force to the cable. The cable retention means provides protection to the cable to reduce damage due to the strain relief.

According to a sixth aspect of the invention, a cable protection member is provided. The cable protection member comprises a deformably resilient material formed into a spiral shape, such that when the cable protection member is placed around a cable the cable protection member deforms causing the cable protection member to grip to itself and to the cable. The cable protection member may be configured to be used with any of the embodiments described herein.

Optionally, the resiliently deformable material is comprised of a material having a coefficient of friction sufficient to ensure that the cable protection member grips the cable sheath and itself when wrapped around a cable. In particular the material may be rubber. Optionally, the resiliently deformable material is silicone.

Optionally, the cable retaining member is comprised of a material that is resistant to one or more of chemical exposure, temperature changes, UV light, compression or crushing. This can be achieved by forming the resiliently deformable material from silicone.

The cable protection member may be self-supporting, by which it is meant that it holds its spiral shape without a support structure, reel or similar. Furthermore, the cable protection member does not require an adhesive to be applied.

Additional features and advantages will be set forth in the detailed description which follows, and in part will be readily apparent to those skilled in the art from that description or recognized by practicing the invention as described herein, including the detailed description that follows, the claims, as well as the appended drawings.

It is to be understood that both the foregoing general description and the following detailed description present embodiments and are intended to provide an overview or framework for understanding the nature and character of the disclosure. The accompanying drawings are included to provide a further understanding and are incorporated into and constitute a part of this specification. The drawings illustrate various embodiments, and together with the description serve to explain the principles and operation of the concepts disclosed.

BRIEF DESCRIPTION OF THE DRAWINGS

FIGS. 5a, 5b and 5c illustrate a cable sealing apparatus according to embodiments of the present invention.

FIG. 7 illustrates an exploded view of the components of a cable sealing apparatus according to embodiments of the present invention.

DETAILED DESCRIPTION OF THE INVENTION

Reference will now be made in detail to certain embodiments, examples of which are illustrated in the accompanying drawings, in which some, but not all features are shown. Indeed, embodiments disclosed herein may be embodied in many different forms and should not be construed as limited to the embodiments set forth herein; rather, these embodiments are provided so that this disclosure will satisfy applicable legal requirements. Whenever possible, like reference numbers will be used to refer to like components or parts.

Figure 1:
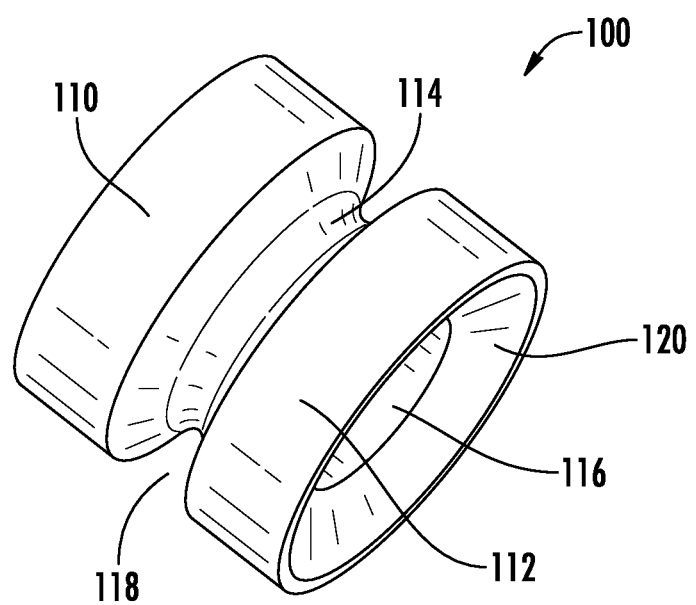
FIG. 1 illustrates a first sealing member according to embodiments of the present invention.

FIG. 1 shows a sealing member 100, e.g. a grommet, according to an embodiment of the present invention. The sealing member is for providing a seal around a cable, such as an electrical cable or a fiber-optic cable. The sealing member 100 comprises a resiliently deformable material. That is, the sealing member is made from a resiliently deformable material. The sealing member has a passage 116 along its axis for receiving a cable. The sealing member may be generally cylindrical in nature. The sealing member has a first end 110 (or end portion) and a second end 112 (or end portion) and an intermediate portion 114. The first end 110 is disposed at the opposite end of the sealing member 100 from the second end 112, that is, at opposite ends along the axis of the sealing member 100. The intermediate portion 114 is disposed between the first end 110 and the second end 112.

The intermediate portion 114 comprises a circumferential groove 118 disposed upon its outer surface. As a result of the groove 118 the wall of the sealing member 100 is thinner at the intermediate portion 114 where the circumferential groove 118 is located. The circumferential groove 118 is preferably a "V" shaped groove (i.e. the groove has a "V" shaped cross section), as illustrated, though other shaped grooves may also be used. For example, a "U" shaped groove or a square or rectangular groove may be used. The groove may be considered a portion of removed material from the sealing member.

The circumferential groove 118 is disposed between the first end 110 and the second end 112 such that when a compressing force is applied to the sealing member 100 at the first end 110 and the second end 112 along the axis of the sealing member 100, the sealing member 100 deforms at the intermediate portion 114 to cause the passage 116 to narrow. When such a compressive force is applied to the sealing member 100 while a cable is disposed within the passage 116, the narrowing of the passage 116 caused by the compressive force creates a seal about the cable. The effect of the circumferential groove 118 is to increase the amount that the sealing member 100 can deform and hence how much passage 116 can be narrowed. This, in turn, increases the range of cable thicknesses that the sealing member 100 can provide a seal around.

The sealing member may also comprise a conic cutaway 120 at the first end and the second end. This may provide a bevelled edge. Preferably, the conic cutaway 120 is coaxial with the sealing member 100 as illustrated. As a result of the conic cutaway 120 when a compressive is applied by a face that is perpendicular to the axis of the sealing member 100 (e.g. via a flange), the outer edge of the sealing member 100 is the first part of the sealing member 100 to be engaged. As the compressive force increases, the sealing member 100 deforms at the conic cutaway 120 to present an increasingly large face perpendicular to the axis of the sealing member 100 for receiving the compressive force. This has the effect of directing the incoming compressive force to the intermediate portion 114 of the sealing member 100, further aiding the deformation of the intermediate portion 114 to narrow the passage 116 and allow the sealing member 100 to create a seal around yet smaller cables than it would be able to without the conic cutaway 120.

According to a different embodiment of the invention, a multi sealing member for providing seals around two or more cables may be provided. Such a multi sealing member may comprise two or more sealing members, such as those described above with respect to FIG. 1. The two or more sealing members may be joined together by one or more adjoining portions. In some embodiments, each sealing member may be arranged circumferentially around a unitarily formed adjoining portion, whilst in others each sealing member may be connected to two other sealing members by an adjoining portion comprised of a plurality of sections.

Figure 2A:
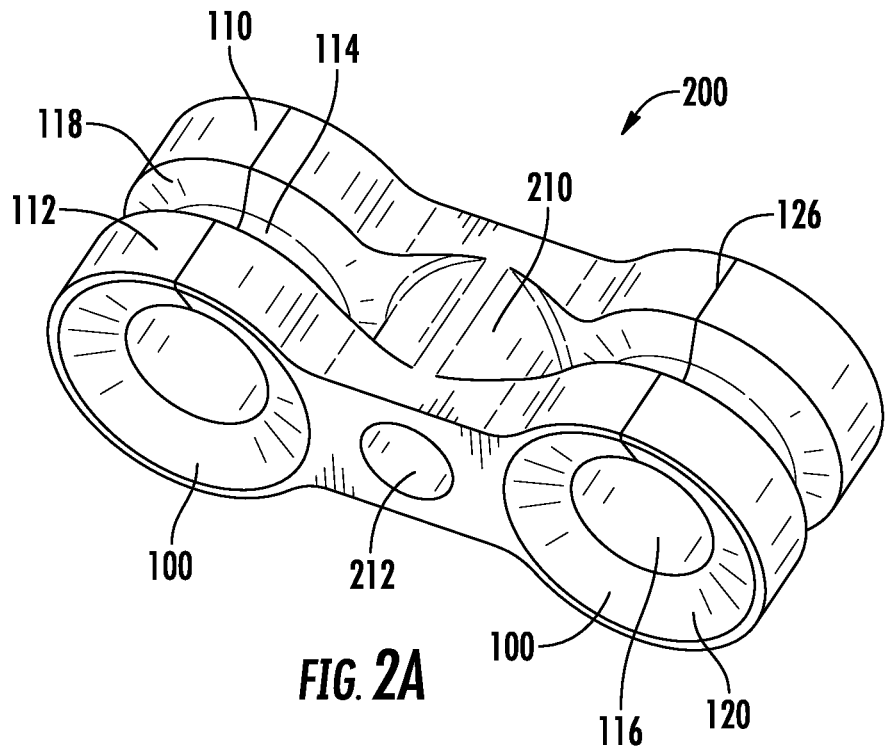
FIGS. 2a and 2b illustrate two views of a second sealing member according to embodiments of the present invention.
Figure 2B:
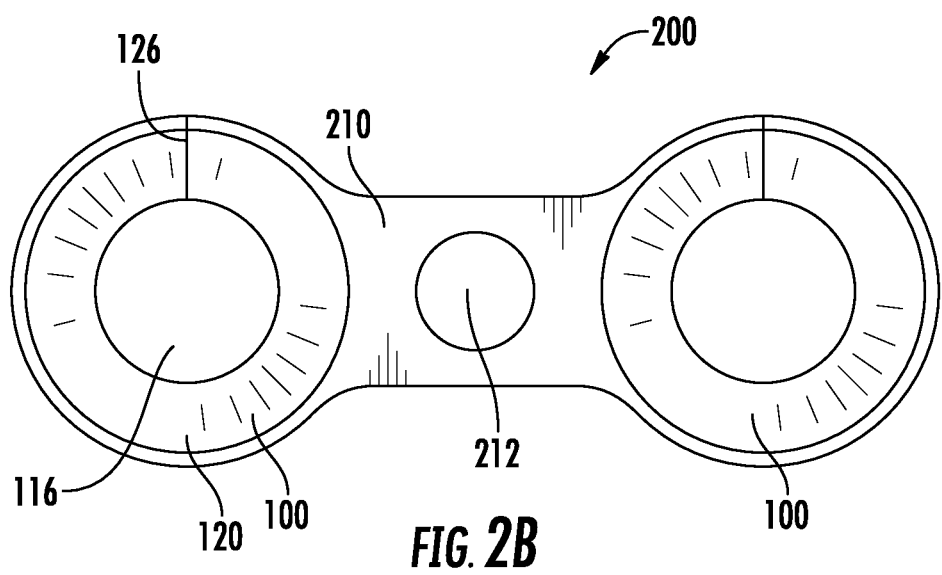

FIGS. 2a and 2b show a multi sealing member according to an embodiment of the present invention. In this embodiment, the multi sealing member has two sealing members, and so is also a dual sealing member. It is understood that the features described in relation to dual sealing members can be equally be applied to multi sealing members more generally, and that the dual sealing member is simply used to illustrate these features by way of an example.

These figures show two different views of a dual sealing member 200. As can be seen in these figures, the dual sealing member 200 comprises first and second sealing members 100 substantially as described in relation to FIG. 1. These sealing members 100 are connected via an adjoining portion 210.

Preferably, as illustrated in FIGS. 2a and 2b, each sealing member 100 in the dual sealing member 200 is identical, that is, they comprise all of the same features such as circumferential groove 118, conic cutaway 120, and slit 126 that will be described in more detail below. It is also preferable that the dual sealing member 200 is symmetrical. As shown, dual sealing member 200 is symmetrical about a plane dividing the screw passage 212 along its length. That is to say, the dual sealing member 200 is symmetrical about a plane perpendicular to a line that is perpendicular to and passes through the axis of each sealing member 100. More generally for a multi sealing member, each sealing member of the multi sealing member may be circumferentially arranged around an adjoining portion or, more preferably, about a passageway for a compressor component, such as a screw passage, disposed in the adjoining portion. The passageway is preferably disposed centrally in the adjoining portion.

As described above in relation to FIG. 1, each sealing member 100 of the dual sealing member 200 comprises a passage 116, a first end 110, a second end 112 and an intermediate portion 114 comprising a circumferential groove 118. The first 110 and second 112 ends again both comprise a conic cutaway 120. Preferably, a circumferential groove 118 circumscribes the intermediate portion 114 of each sealing member 100 such that the adjoining portion 210 connects to the first 110 and second 112 ends of each sealing member 100 but a gap is formed between the intermediate portions 114 and the adjoining portion such that the adjoining portion 210 does not contact the intermediate portion 114 where the circumferential groove 118 is disposed.

The axes of both sealing members 100 may be parallel. This means that both sealing members deform to create a seal as a result of a compressive force in the same direction (i.e. parallel to their axes).

As illustrated, the adjoining portion 210 may comprise a screw passage 212 for receiving a screw. The screw passage 212 is disposed parallel to the axes of the sealing members 100. The screw passage 212 enables a screw to be placed through it which can engage with a flange disposed at either end of the dual sealing member 200. By rotating the screw, the flanges can be brought closer together along the axis of the screw (and hence, along the axes of the sealing members 200 which are parallel to the axis of the screw) to provide the required compressive force to cause the intermediate portions 114 of the dual sealing member 200 to deform to provide a seal around a cable inserted into each passage 116 in the dual sealing member 200.

As illustrated in FIGS. 2a and 2b, each sealing member 100 may also comprise a slit 126. This slit 126 passes from outside each sealing member 100 into the passages 116 and runs from the first end 110 to the second end 112 of each sealing member. By opening each sealing member via the slit, a cable can be placed within the sealing member 100 without the end of the cable having to be passed through the passage 116. That is, the sealing member 100 can be placed around a middle portion of a cable without the end of the cable having to first be passed through the passage 116 and the rest of the cable then pulled through behind.

Figure 3:
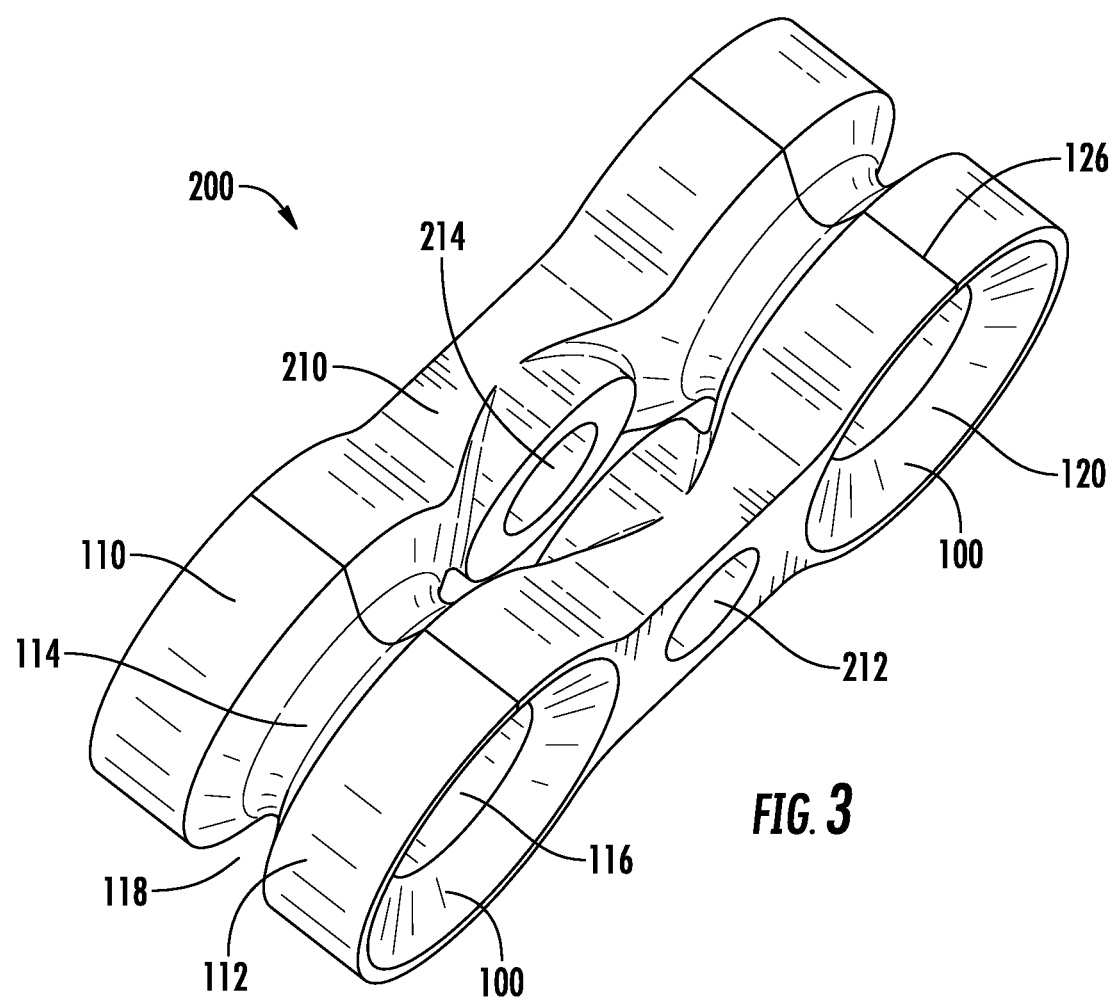
FIG. 3 illustrates a third sealing member according to embodiments of the present invention.

FIG. 3 illustrates another dual sealing member 200 according to an embodiment of the present invention. Dual sealing member 200 in FIG. 3 is substantially the same as that disclosed in FIGS. 2a and 2b, except that the adjoining portion 210 has a gap 214. The adjoining portion 210 includes a first portion that adjoins or connects the first ends 110 of the sealing members 100 and a second portion that adjoins or connects the second ends 112 of the sealing members with the first and second portions of the adjoining portion 210 being separated to define a gap 214 between them. The first 110 and second 112 ends of each sealing member 100 may therefore only be connected through the intermediate portions 114 and not through the adjoining portion 210.

Having a gap 214 in the adjoining portion 210 ensures that the two sealing members 100 can be connected to form a dual sealing member 200 without affecting the compressibility of each sealing member 100. That is, because of gap 214, the adjoining portion does not create any extra resistance to a compressive force applied to the first 110 and second 112 ends. This is because the size of the gap 214 can reduce to compensate for the compressive force by the first portion of the adjoining portion 210 moving towards the second portion of the adjoining portion 210.

Figure 4A:
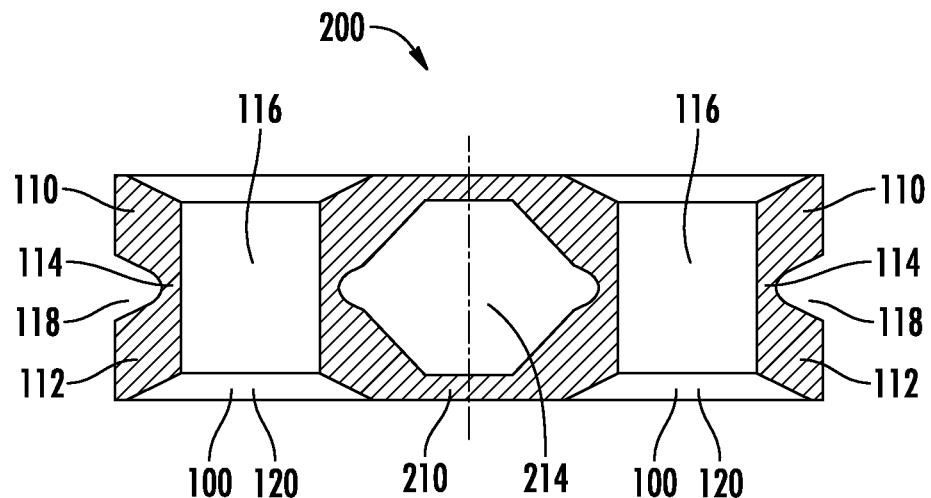
FIGS. 4a and 4b illustrate a cross section of a sealing member according to embodiments of the present invention in an uncompressed and compressed state respectively.
Figure 4B:
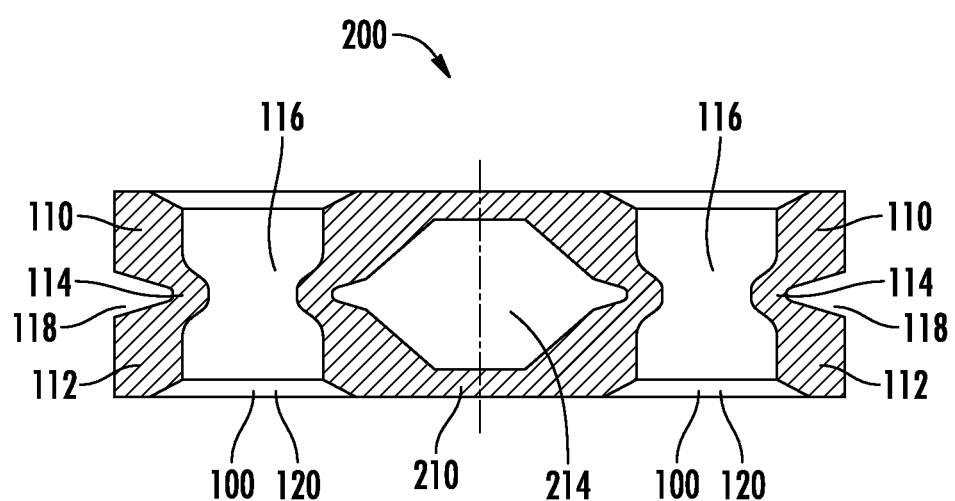

FIGS. 4a and 4b show cross sections of the dual sealing member 200 illustrated in FIG. 3. FIG. 4a shows a cross section of the dual sealing member 200 in an uncompressed state, whilst FIG. 4b shows a cross section of the dual sealing member 200 in a compressed state.

Looking first at FIG. 4a, it can be seen that the cross section is taken in the plane through which the axes of the sealing members 100 lie. As discussed in relation to the previous figures, the dual sealing member 200 comprises a pair of sealing members 100 connected via an adjoining portion 210. The adjoining portion comprises a gap 214, but for simplicity, the screw passage 212 is not shown. Each sealing member 100 comprises a passage 116, a first end 110 and a second end 112 connected by an intermediate portion 114, the intermediate portion 114 comprising a circumferential groove 118. Both the first end 110 and the second end 112 of each sealing member 100 may comprise a conic cutaway 120.

In the relaxed or uncompressed state shown in FIG. 4a, the passage 116 has straight sides. That is, the passage 116 defines an opening of a constant diameter through the sealing member as the passage 116 passes from the first end 110 to the second end 112. The opening may be cylindrical in cross section.

Turning to FIG. 4b, in the compressed state (i.e. when a compressive force is applied along the axes of the sealing members to the first ends 110 and the second end 112) the passage 116 has changed shape. In a compressed state, the passage 116 is narrowed due to the deformation of the intermediate portion 114 of the sealing member 100 at the location of the circumferential groove 118. By compressing the dual sealing member 200 in this manner, the passages 116 can be sufficiently narrowed to create a seal around cables passing through the passages.

As can be seen in FIG. 4b, the sealing members 100 deform to the greatest extent (i.e. the passages 116 are narrowed to the greatest extent) at the location of the circumferential grooves 118 in the intermediate portions 114 of the sealing members 100. This is because the sealing member 100 walls are thinnest at this point, meaning that it is most flexible and deformable at this point, and also because the compressive force is focused in this region due to the narrowing of the sealing member 100 by the circumferential groove 118. This means that, as compared to prior art grommets and sealing members, a sealing member according to the present invention may have a greater range of deformation and can provide a seal around a much greater range of cable thicknesses.

As also illustrated in FIGS. 4a and 4b, when the dual sealing member 200 is compressed, the outer edge of the first 110 and second 112 ends of the sealing members 100 are compressed first. This is because of the conic cutaway 120, which ensures that the outer edge of the sealing member 100 (i.e. the edges the greatest radial distance from the axes of the sealing members 100) are the first portion of the sealing member 100 engaged by a surface transmitting the compressive force to the dual sealing member 200. By having an outer area initially receive the compressive force, the force is directed towards the intermediate portions 114 of the sealing member 100, further aiding in their deformation. Combined with the circumferential grooves 118, the conic cutaways 120 enable an even greater range of deformation and thus a greater range cable thicknesses around which a seal can be created.

It can be seen in FIGS. 4a and 4b that the adjoining portion 210 contains gap 214 meaning that the intermediate portions 114 of each sealing member 100 are not connected. As discussed in relation to FIG. 3, this gap 214 means that the adjoining portion 210 does not create any additional resistance to an applied compressive force.

FIGS. 5a to 5c show a cable sealing apparatus at various levels of assembly. Starting with FIG. 5a, a dual sealing member 200 is shown along with a first flange 510, a second flange 512, a screw 514 and a nut 516. The dual sealing member 200 may be any of those discussed in relation to any of FIGS. 2 to 4b, or a dual sealing member 200 according to a different embodiment of the invention. The techniques and apparatuses described can also be applied to types of multi sealing member other than dual sealing members, having more than two sealing members.

The first flange 510 abuts the first end of the dual sealing member 200 whilst the second flange 512 abuts the second end of the dual sealing member 200. In FIG. 5a, only lower portions of the first 510 and second 512 flanges are illustrated. Such flanges 510, 512 are optionally constructed from two portions, such as an upper and a lower portion or a first and a second portion. This enables the flanges to be constructed around a cable in situ, i.e. at the point of the cable that the flange is required, rather than requiring the end of the cable to be passed through the flange and then the rest of the cable to be pulled through after until the flange is in the correct location on the cable. However, while in FIG. 5a flanges 510, 512 are illustrated as being made from two portions, other types of flange could be used. For example, the flanges may be formed from a single component and have a "U" shape to fit around a cable, or may have a hinged portion that can be opened to allow the flange to be placed around a cable and then closed to retain the flange around the cable and to provide an even surface for engaging the dual sealing member 200.

The screw 514 passes through the first flange 510, through the screw passage in the dual sealing member 200 and into the second flange 512 where it is threaded into a nut 516. Nut 516 is retained within the second flange 512, such that when screw 514 is turned then both the nut 516 and the second flange 512 are urged towards the head of the screw 514. However, the head of the screw 514 engages with the first flange 510 causing the second flange 512 be pulled towards the first flange 510. The first 510 and second 512 flanges moving together in this way compresses the dual sealing member 200 between them, and accordingly provides the compressive force required to deform the dual sealing members and cause a seal about any cables inserted into the dual sealing member.

This effect is illustrated in FIG. 5b. Arrow 502 illustrates the rotation of screw 514, while arrows 504 and 506 illustrate the motion of the first 510 and second 512 flanges with respect to each other. Note that in FIG. 5b, the flanges 510, 512 are shown in their completed state, with both their upper and lower portions attached together. This obscures the screw 514 and nut 516 within, though the head of screw 514 can still be seen protruding from the first flange 510.

FIG. 5c shows the cable sealing apparatus 500 with the addition of casing 518. This casing 518 allows the cable sealing apparatus 500 to be integrated or installed in other equipment, providing a sealed means for cable to enter the other equipment. To this effect, casing 518 is preferably provided with a washer or O-ring 520, which may be made from rubber. This O-ring 520 creates a seal between the casing 518 and the external equipment into which the casing 518 is installed.

Casing 518 is also provided with cable retention means 522 and 524. Cable retention means 522 consist of openings through which a cable or cables can pass and a screw that can be tightened to narrow the opening to retain the cable or cables. Cable retention means 524 comprises a pair of arms. A cable may be connected to these arms via a clip or tie, such as a cable tie or worm drive clip, and hence retained.

The cable sealing apparatus illustrated in FIG. 5c may also optionally comprise a breakable screw head 600 disposed over the head of screw 514. This breakable screw head 600 has a number of functions both when used with prior art cable sealing apparatuses and when combined with cable sealing apparatuses according to the present invention, such as those shown in FIGS. 5a to 5c. The breakable screw head 600, or the portion of the breakable screw head 600 through which torque is applied, is configured to detach from the screw 514 when a predetermined torque is applied to the breakable screw head 600, preventing the screw 514 from being further tightened with the breakable screw head 600. The breakable screw head 600 will now be further discussed in relation to FIGS. 6a to 6c.

Figure 6C:
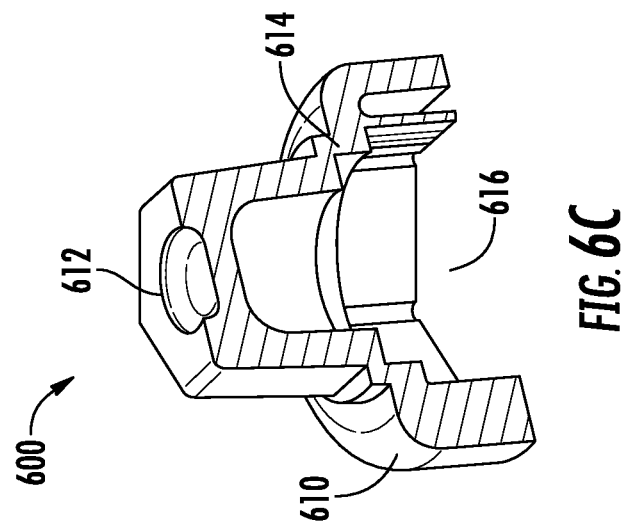
FIGS. 6a, 6b and 6c illustrate a breakable screw head for use in the sealing apparatus of embodiments of the present invention.
Figure 6B:
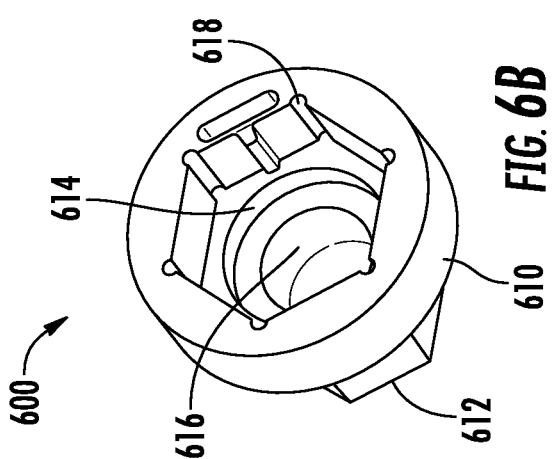
Figure 6A:
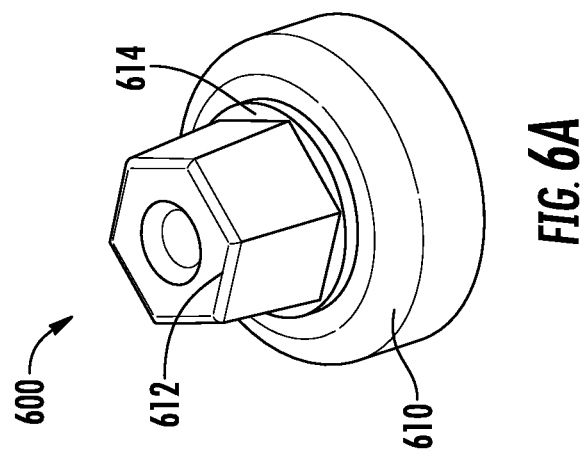

FIGS. 6a and 6b each show a different view of breakable screw head 600 while FIG. 6c shows a cross section of breakable screw head 600. Looking first at FIGS. 6a and 6b, it can be seen that breakable screw head 600 comprises a cap portion 610 which is configured to fit over the head of a conventional screw. In the illustrated embodiment, cap portion 610 has a hexagonal recess 616 that is configured to fit over a hexagonal screw head, though in other embodiments screw head 600 may be configured to fit over different types of screw head. For example, the recess 616 may be a shape other than hexagonal, or may comprise a protrusion for engaging a screw, such as a hexagonal protrusion for engaging a screw that requires a hex key. As illustrated in FIG. 6b, recess 616 may have rounded corners 618 to avoid force concentrating at the corners when the breakable screw head 600 is twisted.

In addition to cap portion 610, breakable screw head 600 also comprises a head portion 612 which is connected to the cap portion 610 via frangible portion 614. The head portion 612 is configured to be engaged by a tightening device. For example, in FIG. 6, the head portion 612 is hexagonal for engagement with a wrench or spanner, though other configurations could be used as required.

The frangible portion 614 is configured to break when a certain force is applied. That is, the frangible portion 614 is configured to break when a predetermined torque is applied to the head portion 612, separating the head portion 612 from the cap portion 610.

Such a breakable screw head prevents the screw over which the breakable screw head is disposed from being tightened beyond the predetermined torque. It can also prevent an engineer applying too little torque, because they can simply be instructed to tighten a screw until the breakable screw head breaks. The breaking of the breakable screw head means that the screw has been tightened to at least the predetermined torque. Accordingly, such a breakable screw head can obviate the need for the complex and small markings used in the prior art to indicate when the screw of a cable sealing apparatus had been sufficiently tightened. An engineer simply needs to tighten the screw until the frangible screw head breaks in order to ensure that the cable sealing apparatus has been correctly tightened. This benefit is realised whether a breakable screw head is applied to a cable sealing apparatus according to the present invention of a cable sealing apparatus known in the prior art.

Such a frangible screw head can be used with any suitable cable sealing apparatus in which a seal is formed around a cable by applying a compression force to the sealing member or grommet using a screw. The frangible screw head is particularly advantageous when used in conjunction with a cable sealing apparatus according to the present invention because it provides a means for an engineer to ensure that the cable sealing apparatus has been correctly tightened regardless of the thickness of the cable that the cable sealing apparatus is being used with. This is advantageous as the cable sealing apparatuses of the present invention can be used with a very wide range of cable thicknesses. In such a situation, it would become confusing if a different indicator marking were provided on the flanges for each cable thickness that the sealing apparatus could be used with because it would require a large number of small, closely spaced markings. However, the use of such a breakable screw head overcomes this problem.

The predetermined torque at which the frangible portion of the breakable screw head breaks can be determined by varying the thickness of the material of the frangible portion, which may be a plastic material for example. Whilst the required predetermined torque will vary across different use cases, it has been found that for providing sealing around cables a torque of at least 4.5 N M is suitable. Preferably, this is achieved across the whole range of operating conditions required for the apparatus, such as across a temperature range of −15° C. to +45° C.

FIG. 7 shows an exploded view of cable sealing apparatus 500 depicted in FIG. 6c. It illustrates how the breakable screw head fits over the head of screw 514, which passes through the first flange 510, the dual sealing member 200 and into the second flange 512 where it engages with the nut 516 which is retained within the second flange 512. The first flange 510, the dual sealing member 200 and the second flange 512 are then disposed within casing 518, and the cable retention means 522 and 524 are attached.

The sealing members described above in accordance with the present invention comprise a single constituent piece of resiliently deformable material. The sealing member should advantageously have a hardness of less than 70 ShA, as measured with a Shore Type A Durometer according to ASTM D2240-00. A suitable material for the sealing member is a thermoset rubber, such as (but not limited to) one of silicone rubber, polyurethane rubber and nitrile rubber (NBR).

It has been found that a single sealing member having an outer diameter of approximately 24 mm and a passage diameter of approximately 12 mm (e.g. 12.4 mm), a maximum width of about 6 mm and depth of about 8 mm (e.g. 8.4 mm) for the circumferential groove, a difference in depth of around 2.4 mm between the front and rear portions of the conic cutaway, and a length of around 20 mm from the first end to the second end can provide a seal around a range of cables differing in diameter by up to 12 mm, up to a cable of thickness of 12 mm in diameter. In existing solutions, a sealing member of grommet only provides a seal around a range of cable thicknesses differing in diameter by up to 3 mm.

Any embodiments of the invention may be implemented in a system employing a suitable sealing arrangement, such as a 3M™ External Cable Assembly Module (ECAM) Double Cable Entry Port such as the ECAM-18MM-D, also known as a double ECAM, or similar.

Furthermore, the embodiments of the invention described above may also be provided with a cable protection means. As modern cables are developed having thinner and thinner sheaths, forces applied to provide strain relief or to retain the cable (e.g. clamping the cable) can often have detrimental effects on the cable. For example, the sheath may break exposing the inner core when a cable retention means is applied to the cable, or compression of the core may cause attenuation or signal loss, or the cable or its constituent components may be damaged in some other way.

Figure 8A:
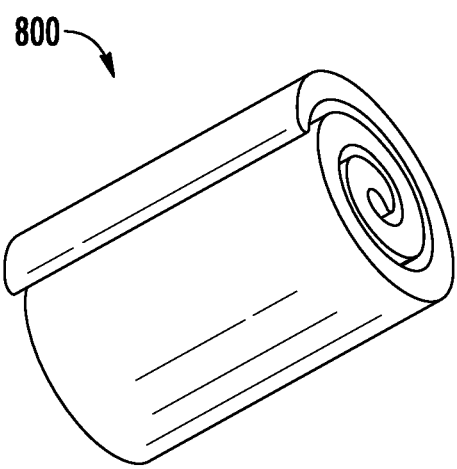
FIGS. 8a and 8b illustrate a cable protection member that can be used in embodiments of the present invention.
Figure 8B:
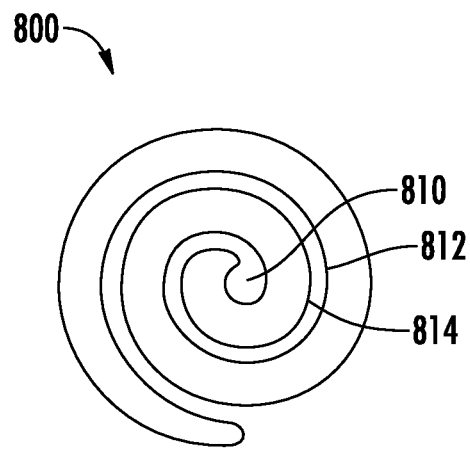

An example of a cable protection member that can be used with any embodiment of the present invention is shown in FIGS. 8A and 8B. The cable protection member 800 comprises a resiliently deformable material, such as silicone, that is formed or moulded into a spiral shape.

The spiral shape of the cable protection member in its initial state is clearly illustrated in FIGS. 8A and 8B. The initial state, or neutral state, is the state when no outside forces are applied before application of the cable protection member to a cable. The cable protection member 800 comprises a single unitary piece formed or moulded in the shape of cylindrical spiral. That is, the cable protection member has a longitudinal axis 810 with a constant cross section along the axis. Such a cross section, which is equivalent to an end-on view of the cable protection member, looking down the longitudinal axis, has a spiral shape as illustrated in FIG. 8B.

The longitudinal axis 810 may be a central axis or it may be slightly off-centre. This axis is configured to have a cable placed along it. In some embodiments, the cable protection member may be formed such that in the neutral state of the cable protection member 800 the axis has a central passage defined along it for receiving a cable. In other embodiments, however, no such passage is defined in the neutral state of the cable protection member 800.

Along any given radial line from the longitudinal axis (i.e. a line starting from and perpendicular to the longitudinal axis 810), a number of layers are defined. This number need not be constant but may vary depending upon which radial line is chosen due to the spiral shape of the cable protection member 800. As can be seen in FIG. 8B, a radial line extending from axis 810 will, in some cases, pass through two layers and in other cases pass through three layers of the cable protection member 800. Each layer comprises an inner surface 812 and an outer surface 814. In the initial state of the cable protection member 800, there may or may not be a gap or space between the inner surface 812 and the outer surface 814. In FIG. 8B, it can be seen that such a gap is present between inner surface 812 and outer surface 814.

During use, the cable protection member 800 is placed around a cable, such that the cable passes through the middle of the cable protection member 800. By the cable passing through the middle of the cable protection member 800, it is meant that the cable passes through the cable protection member along the longitudinal axis of the cable protection member 800. When placed around a cable in this manner, the cable protection member 800 is a least partially uncurled. The spiral shape of the cable protection member 800 therefore provides a restorative force, urging the cable protection member 800 to curl back to its initial state described above. However, due to the presence of the cable running through the cable protection member 800, the cable protection member 800 is unable to fully return to its initial state. Because the cable prevents the cable protection member 800 from completely returning to its neutral state, the cable protection member 800 exerts a force on the cable. This helps to generate friction between the cable and the cable protection member 800, which in turn contributes to causing the cable protection member 800 to grip the cable.

Furthermore, when a cable is placed through the cable protection member 800, the inner layers of the spiral must deform from the initial state, urging the outer surface 814 of inner portions of the cable protection member 800 into contact, or into closer contact, with the inner surface 812 of outer portions of the cable protection member 800. This contact generates a frictional force between the inner surface 812 and outer surface 814 of the cable protection member 800, meaning that the cable protection member 800 grips to itself.

Figure 9A:
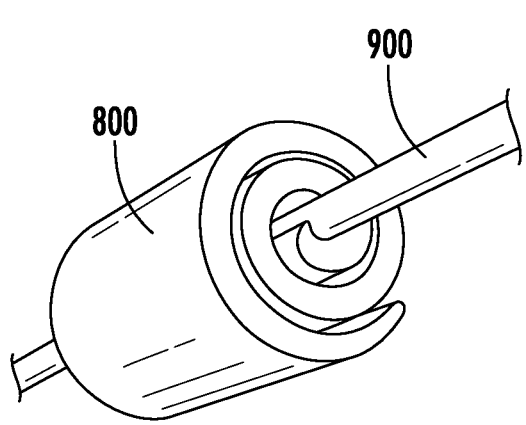
FIGS. 9a and 9b illustrate a cable protection member in use around a cable.
Figure 9B:
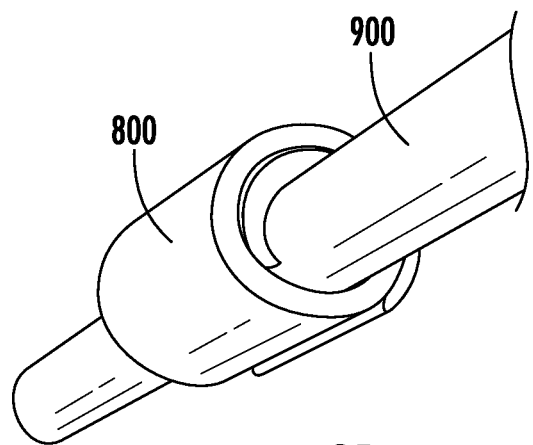

FIGS. 9A and 9B illustrate the cable protection member 800 of FIGS. 8A and 8B in place around two different cables 900. FIG. 9A shows the cable protection member 800 in place around a narrow, or small diameter, cable 900, whilst FIG. 9B shows the cable protection member 800 in place around a thick, or large diameter, cable 900. As can be seen, because of the spiral nature of the cable protection member 800, the cable protection member 800 can be used with a wide range of cable thicknesses. This is because the spiral shape allows for a great amount of deformation around the cable 900, as well as being able to provide the required restoring force necessary to cause the cable protection member 800 to grip to the cable 900 for a wide range of cable thicknesses.

As compared to alternative solutions, such as the use of specific grommets or rubber tape taken from a reel and cut to size, the cable protection member 800 provides a single type of device can be carried and applied to a variety of sizes of cable that an engineer may have to deal with in the field. For example, traditional grommets are specifically sized for each cable diameter and are difficult to retain in place whilst an engineer is working as they do not grip the cable. Whilst tape can be applied to a variety of cable diameters it requires the engineer to cut the tape to length from a reel which can be difficult to judge and requires further tools and equipment. The cable protection member 800, on the other hand, can address a wide variety of cable thicknesses without requiring any special judgement by the engineer, further tools or equipment to be carried, or different size cable protection members 800 to be carried. Furthermore, because the cable protection member 800 uses the friction of the material it is made from and the restoring force of the spiral shape to stay in place, it does not need to use any adhesive and so is easily removable if required.

As previously mentioned, when in place around a cable 900, the cable protection member 800 deforms to accommodate the cable 900. Comparing FIGS. 9A and 9B, it can be seen that the amount of deformation the cable protection member 800 undergoes varies depending upon the width of the cable 900 around which it is placed. When the cable protection member 800 is placed around a thinner cable compared to a thicker cable, such as the cable illustrated in FIG. 9A, it undergoes relatively little deformation because the cable does not require a large space to pass through. When the cable protection member 800 is placed around a thicker cable compared to a thinner cable, such as the cable illustrated in FIG. 9B, it undergoes relatively greater deformation.

The deformation caused by the cable protection member 800 being placed around a cable 900 changes the number of degrees through which the spiral shape turns. This is because the cable 900 displaces the interior portions of the cable protection member 800 meaning that the inner most surface of the cable protection member (the surface closest to the longitudinal axis) is at a greater distance from the longitudinal axis than when the cable protection member 800 is in its initial state. This leads to fewer layers of the cable protection member 800 encircling the cable 900. This effect is greater (i.e. the number of degrees through which the spiral shape turns is fewer) when the cable protection member 800 is placed around thicker cables, and so the cable protection member 800 will have fewer layers when placed around a thicker cable compared to a thinner cable.

For example, in FIG. 9A it can be seen that there are either two or three layers of the cable protection member 800 over any portion of the cable 900. However, in FIG. 9B it can be seen that there are only between one and two layers of the cable protection member 800 over any portion of the cable 900. Such an effect is advantageous because it means that the outer diameter of the cable protection member 800 once placed around a cable 900 varies relatively little as the thickness of cable 900 is varied because as the thickness of the cable 900 increases, the number of layers of the cable protection member 800 encircling it decreases. This means that devices or apparatuses that are to be placed around the cable 900 and cable protection member 800 can accommodate a wider range of cable thicknesses, because this translates to a smaller range of possible total thicknesses once the cable protection member 800 is applied.

The cable protection member is preferably made from a high friction material such as a rubber. A suitable material is silicone, which is chemically and thermally resistant. This is preferable so that in use, particularly in an outdoors environment, the cable protection member does not degrade. Additionally, it is advantageous that the cable protection member is UV resistant so as to not degrade in sunlight.

Certain suitable dimensions of the cable protection member have been found. In its initial state the cable protection member is approximately 20 mm in height (that is, 20 mm along the longitudinal axis such that in use the cable protection member covers and protects a 20 mm length of cable) and may be between 15 mm and 25 mm in height. The thickness of the material is preferably approximately 2 mm, and may be between 1.8 mm and 2.2 mm for example. There may optionally be a central passage approximately 2 mm in diameter, which may be between 1.8 mm and 2.2 mm. The maximum outer diameter of the cable protection member may be approximately 15 mm (e.g. 14.8 mm) and may be between 13 mm and 17 mm. Such dimensions mean that, from the longitudinal axis of the spiral, each radial direction passes through either two or three layers of the spiral material. Such dimensions have been found to be able to provide protection at least for cables with diameters between 2 mm and 12 mm. By modifying various parameters, such as any one or more of the diameter of the central passage, the thickness of the material, the length of the material and the number of turns of the spiral, different sized cables can be accommodated. For example, by providing more turns in the spiral and/or a larger diameter central passage, larger cables can be accommodated. By providing a smaller diameter central passage or no central passage, smaller cables can be accommodated. It will be appreciated that due to the nature of the device, i.e. that the cable protection member can be used with a wide variety of cable thicknesses, there is a wide range of sizes and dimensions that would be suitable for use with cables of a given thickness.

Optionally, the cable protection member may be comprised of a material having a hardness value of 50 ShA. Such a value has been found to function well.

Figure 10:
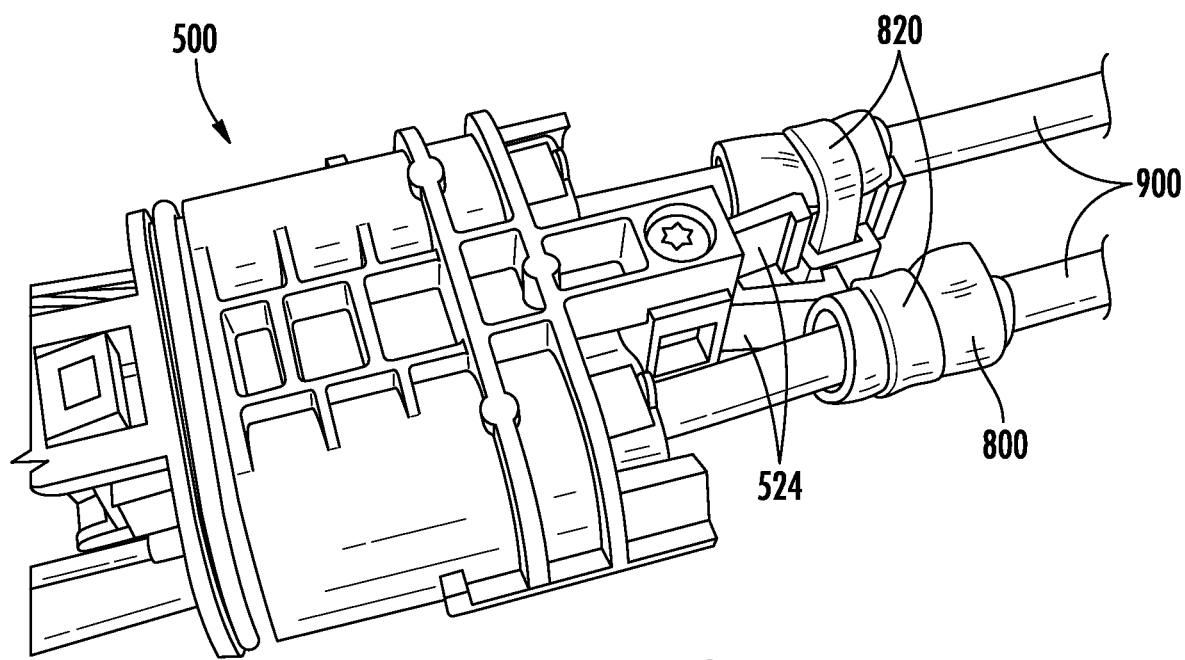
FIG. 10 illustrates a cable protection member used with a cable sealing apparatus in accordance with embodiments of the present invention.

FIG. 10 shows a cable protection member 800 in use with the cable sealing apparatus 500 illustrated in FIGS. 5C and 7. The portion of the cable 900 that is adjacent to the cable retention means 524 can have a cable protection member 800 placed around it. This can then be held in place against the cable retention means 524 with the use of a zip tie 820. Accordingly, the cable is held in place through friction with the cable protection member, and the cable protection member absorbs and disperses the force from the cable tie.

Whilst in FIG. 10 the cable protection member of FIGS. 8A and 8B is shown with respect to the cable sealing apparatus of FIGS. 5C and 7, it will be appreciated that the cable protection member can be used with any type of cable at any particular location along the cable and with any piece of apparatus for use with the cable, including single ECAMs as well as the double ECAM illustrated in FIG. 10. The cable protection member is not limited to be used with the apparatus of FIGS. 5c and 7.

For example, another apparatus that the cable protection member could be used with is a single ECAM, such as an ECAM S12. This type of apparatus uses a clamp-like means to retain the cable and provide strain relief. The clamp-like means may comprise a pair of opposing surfaces which are tightened by a pair of screws to clamp down upon a cable placed between the opposing surfaces. The cable protection member can be wrapped around a cable, such that the clamp-like means clamp down upon the cable protection member rather than the cable itself. Accordingly, the cable is held in place through friction with the cable protection member, and the cable protection member absorbs and disperses the force from the clamp-like means.

As used herein, the term "cable" encompasses both electrical cables which includes all types of wires and/or cables for transmitting electrical power or electrical signals and fiber optic cables and/or optical fibers which include all types of single mode and multi-mode light waveguides as well as any other form of wire or cable with which the invention would work. Such cables, being electrical cables or fiber-optic cables or any other form of cable, may include one or more cores or wires or optical fibers that may be upcoated, colored, buffered, ribbonized and/or have other organizing or protective structure in a cable such as one or more tubes, strength members, jackets, sheaths or the like. Types of suitable optical fibers include bend-insensitive optical fibers, or any other expedient of a medium for transmitting light signals. An example of a bend-insensitive optical fiber is ClearCurve® Multimode fiber commercially available from Corning Incorporated. Types of electrical cable include coaxial cables, multicore cables, power cables and the like.

It is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A sealing member for providing a seal around a cable, the sealing member comprising a resiliently deformable material and having a passage along its axis for receiving the cable,
   wherein the sealing member comprises a first end, a second end and an intermediate portion, the first end disposed at an opposite end of the sealing member from the second end along the axis and the intermediate portion disposed between the first end and the second end,
   wherein the intermediate portion comprises a circumferential groove disposed on its outer surface such that when a compressing force is applied to the first end and the second end along the axis of the sealing member the intermediate portion deforms to cause the passage to narrow, and
   wherein the adjoining portion includes a first portion that adjoins the first ends of the respective sealing members and a second portion that adjoins the second ends of the respective sealing members and wherein the first portion and the second portion are separated such that a gap is defined between them.

2. The sealing member of claim 1, wherein the first and second ends each comprise a conic cutaway wherein the axis of the conic cutaway is coaxial with the axis of the sealing member.

3. The sealing member of claim 1, wherein the groove has a "V" shaped cross section.

4. The sealing member of claim 1, wherein the sealing member comprises a slit running from the first end to the second end to enable a cable to be placed into the passage through the slit.

5. The sealing member of claim 1, wherein the sealing member is constructed from a thermoset rubber with a hardness of less than 70ShA, wherein optionally the thermoset rubber is one of silicone rubber, polyurethane rubber, and nitrile rubber (NBR).

6. A multi sealing member for providing seals around two or more cables, the multi sealing member comprising two or more sealing members as claimed in claim 1, each of the two or more sealing members joined to the other sealing members by an adjoining portion.

7. The multi sealing member of claim 6, wherein the two or more sealing members are arranged circumferentially about a passageway for a compressor component to pass through, the passageway being defined by the adjoining portion.

8. The multi sealing member of claim 6, wherein the multi sealing member is a dual sealing member comprising a first sealing member and a second sealing member.

9. A cable sealing apparatus comprising a sealing member or multi sealing member according to claim 1 and a compression means to apply a compressive force to the first end and second end of the sealing member.

10. The cable sealing apparatus of claim 9, wherein the compression means comprises a first flange configured to abut the first end of the sealing member, a second flange configured to abut the second end of the sealing member, and a compressor component configured to exert a force on the first and second flanges such that the first and second flanges apply a compressive force to the first and second ends of the sealing member.

11. The cable sealing apparatus of claim 10, wherein the compressor component comprises a screw extending along the axis of the sealing member and wherein the first and second flanges engage with the screw such that when the screw is rotated it can cause the first and second flanges to apply a compressive force to the first and second ends of the sealing member.

12. The cable sealing apparatus of claim 11, wherein the screw comprises a breakable screw head configured to detach from the screw when a predetermined torque is applied to the breakable screw head, preventing the screw from being further tightened with the breakable screw head.

13. The cable sealing apparatus of claim 12, wherein the breakable screw head comprises a frangible portion configured to break at a predetermined location.

14. A cable sealing system comprising a cable sealing apparatus according to claim 9 and a cable protection member, the cable protection member comprising a deformably resilient material formed into a spiral shape, such that when the cable protection member is placed around a cable the cable protection member deforms causing the cable protection member to grip to itself and to the cable.

15. A cable sealing apparatus, comprising:
a sealing member for providing a seal around a cable; and
a compression means to apply a compressive force to the first end and second end of the sealing member., the sealing member comprising a resiliently deformable material and having a passage along its axis for receiving the cable,
wherein the sealing member comprises a first end, a second end and an intermediate portion, the first end disposed at an opposite end of the sealing member from the second end along the axis and the intermediate portion disposed between the first end and the second end,
wherein the intermediate portion comprises a circumferential groove disposed on its outer surface such that when a compressing force is applied to the first end and the second end along the axis of the sealing member the intermediate portion deforms to cause the passage to narrow, and
wherein the compression means comprises a first flange configured to abut the first end of the sealing member, a second flange configured to abut the second end of the sealing member, and a compressor component configured to exert a force on the first and second flanges such that the first and second flanges apply a compressive force to the first and second ends of the sealing member.

16. The cable sealing apparatus of claim 15, wherein the first and second ends each comprise a conic cutaway wherein the axis of the conic cutaway is coaxial with the axis of the sealing member.

17. The cable sealing apparatus of claim 15, wherein the groove has a "V" shaped cross section.

18. The cable sealing apparatus of claim 15, wherein the sealing member comprises a slit running from the first end to the second end to enable a cable to be placed into the passage through the slit.

19. The cable sealing apparatus of claim 15, wherein the sealing member is constructed from a thermoset rubber with a hardness of less than 70ShA, wherein optionally the thermoset rubber is one of silicone rubber, polyurethane rubber, and nitrile rubber (NBR).

20. A cable sealing system, comprising:
a sealing member for providing a seal around a cable, the sealing member comprising a resiliently deformable material and having a passage along its axis for receiving the cable, wherein the sealing member comprises a first end, a second end and an intermediate portion, the first end disposed at an opposite end of the sealing member from the second end along the axis and the intermediate portion disposed between the first end and the second end, and wherein the intermediate portion comprises a circumferential groove disposed on its outer surface such that when a compressing force is applied to the first end and the second end along the axis of the sealing member the intermediate portion deforms to cause the passage to narrow;
a compression means to apply a compressive force to the first end and second end of the sealing member; and
a cable protection member, the cable protection member comprising a deformably resilient material formed into a spiral shape, such that when the cable protection member is placed around a cable the cable protection member deforms causing the cable protection member to grip to itself and to the cable.

* * * * *